United States Patent [19]
Cripps et al.

[11] Patent Number: 5,204,613
[45] Date of Patent: Apr. 20, 1993

[54] RF POWER SENSOR HAVING IMPROVED LINEARITY OVER GREATER DYNAMIC RANGE

[75] Inventors: Stephen C. Cripps, Sunnyvale; Thomas R. Allen, San Mateo, both of Calif.

[73] Assignee: Wavetek Microwave, Inc., Sunnyvale, Calif.

[21] Appl. No.: 694,885

[22] Filed: May 2, 1991

[51] Int. Cl.⁵ .......................................... G01R 15/10
[52] U.S. Cl. ..................................... 324/95; 324/119
[58] Field of Search ........................ 324/95, 119, 132; 307/304, 501, 550; 343/703; 333/247; 329/204, 206

[56] References Cited

U.S. PATENT DOCUMENTS

| | | | |
|---|---|---|---|
| 3,388,336 | 6/1968 | Mattern | 330/10 |
| 3,721,900 | 3/1973 | Andrews | 324/95 |
| 3,947,706 | 3/1976 | Holmes | 324/119 |
| 4,207,518 | 6/1980 | Hopfer | 324/95 |
| 4,360,865 | 11/1982 | Yasumura et al. | 363/126 |
| 4,392,108 | 7/1983 | Hopfer | 324/95 |
| 4,752,730 | 6/1988 | Asian | 324/95 |
| 4,873,484 | 10/1989 | Adam | 324/95 |
| 4,943,764 | 7/1990 | Szente et al. | 324/95 |
| 4,958,294 | 9/1990 | Herscher et al. | 364/483 |

*Primary Examiner*—Vinh Nguyen
*Attorney, Agent, or Firm*—Limbach & Limbach

[57] ABSTRACT

A radio frequency ("RF") power sensor providing RF signal power sensing with reduced dependency upon its input signal power level includes multiple series-connected diodes for detecting the power of an input RF signal and providing an output voltage representing that power. The multiple series-connected diodes couple the input node shunted by an input load resistor to the output node shunted by an output filter capacitor. Using multiple series-connected diodes results in reduced reverse bias voltages across the diodes (presented by the charged output filter capacitor), thereby increasing their junction capacitances. These increased junction capacitances, in turn, result in reduced fractional changes thereof (e.g. capacitance "modulation") over changes in the input RF signal power. This reduction in fractional capacitance changes as a function of input signal power variations, further in turn, results in reduced input signal power dependency of the sensors' impedances and sensitivities. Therefore, the power detection performed by the diodes becomes more predictable, e.g. more linear, over a broader input RF signal power range.

12 Claims, 2 Drawing Sheets

RF POWER SENSOR HAVING IMPROVED LINEARITY OVER GREATER DYNAMIC RANGE

BACKGROUND OF THE INVENTION

1. Field of the Invention

The present invention relates to radio frequency ("RF") power sensors, and in particular, to RF diode power detectors.

2. Description of the Related Art

Radio frequency power sensors, or detectors, are widely used for the sensing and measurement of RF and microwave signal power, both absolute and relative. Traditionally, accurate absolute power measurement has been done by using power sensors having thermal sensing elements in which the input RF signal power is used to heat a resistor, the increase in temperature thereof then being related to the incident RF signal power level. Such power sensors can be very accurate at moderate and high power levels, such as 0.01 milliwatt (−20 dBm) and upwards. However, such power sensors are severely limited in their low end sensitivity, such as below 0.01 milliwatt. Further, such sensors have very slow measurement times, typically on the order of 100 milliseconds.

To overcome these problems, power sensors using semiconductor diodes have become widely used, particularly for relative power measurements. They have the advantages of simple construction, high sensitivity (i.e. capable of measuring RF signal power levels well below 0.01 milliwatt) and very fast response times. However, power sensors using semiconductor diodes have a significant problem in that the range of power levels over which they can be used for precise absolute power measurements is significantly limited due to inherent nonlinear characteristics of semiconductor diodes.

Referring to FIG. 1, a schematic circuit diagram of a first-order model of an equivalent circuit of a semiconductor diode 10 used for RF power detection is illustrated. The diode junction can be modeled by an impedance represented by an equivalent junction capacitance $C_J$ (typically on the order of 0.05 picofarads) and an equivalent junction resistance $R_J$ (typically on the order of 1000 ohms) in parallel therewith. In series with this impedance, is an equivalent epitaxial resistance $R_S$ (typically on the order of 20 ohms). In parallel with all of the foregoing is an equivalent parasitic capacitance $C_P$ (typically on the order of 0.02 picofarads) which represents the effective capacitance due to the physical construction and packaging of the diode 10.

The inherent nonlinear characteristic of the diode 10 of primary concern is due to the junction capacitance $C_J$. The parasitic capacitance $C_P$ is typically much smaller than the junction capacitance $C_J$, and therefore has little effect. Significant fractional changes in the junction capacitance $C_J$ cause similar significant changes in the overall impedance of the diode 10. Depending upon other circuit impedances within the circuit (not shown) with which the diode 10 is interacting, the results of this impedance change can introduce significant nonlinear characteristics into the operation of the overall circuit.

Referring to FIG. 2, a schematic circuit diagram of a typical power sensor is illustrated. Shunting the input node to circuit reference, or ground, is a load resistor 30 for absorbing the input RF signal power. The load resistor 30 is typically matched to the line impedance of the circuit or network supplying the input RF signal (e.g. 50 or 75 ohms). Coupling the input and output nodes is the detector diode 20. The diode 20 is conductive on forward RF signal cycles and highly resistive on reverse RF signal cycles. This causes the bypass capacitor 40, shunting the output node to ground, to acquire a positive charge with respect to ground. Ideally, the voltage across the bypass capacitor 40 reaches a steady state value which is approximately equal to the peak value of the RF signal voltage developed across the load resistor 30. Thus, in this steady state condition, the diode 20 is no longer forward biased by the input RF signal, so no further current flows to the output node.

In reality, the characteristics of the diode 20 are not ideal. For small levels of RF input signal voltage, the diode 20 is always conductive, albeit more strongly on forward cycles and less strongly on reverse cycles of the RF input signal. This conductivity of the diode 20 can be approximated by the following formula:

$$I = I_o(e^{V/(KT)} + 1)$$

where:
I = diode current
$I_o$ = reverse saturation current
e = base of natural logarithms $\approx$ 2.7182818
V = diode junction voltage
K = Boltzmann's constant $\approx$ 8.61×10$^{-5}$ eV/° K
T = temperature (° K)

Given a few calibration points to determine the constant $I_o$ for the above equation, this equation could be used to predict the output voltage versus input power characteristics of virtually any detector diode. However, the relationship defined by the above formula is accurate for only relatively low RF input signal power levels (e.g. up to 0.01 milliwatt) within what is referred to as the "square law" operating region.

Referring to FIG. 3, a schematic circuit diagram of an improved power sensor circuit is illustrated. This improved power sensor is a "balanced" detector which has a differential output. Greater input signal sensitivity is achieved since the voltages developed across the bypass capacitors 41, 42, via the two diodes 21, 22, are combined to produce a differential output signal. This allows differential amplification of the output signal, which is inherently less noisy, and reduces sensitivity to even harmonics at higher input RF signal power levels.

Referring to FIG. 4, a schematic circuit diagram of an improved balanced detector is illustrated. At RF input signal frequencies in the gigahertz ("GHz") region, the capacitances of the detector diodes 21, 22 and their associated packages tend to shunt the RF load resistance 30. This causes the input voltage standing wave ratio ("VSWR") of the sensor circuit to deteriorate, thereby reducing input signal sensitivity. To reduce the effects of the aforementioned capacitances, "damping resistors" 51, 52 are used in series with the diodes 21, 22 to shield the diodes' capacitances from the circuit or network providing the input RF signal, with little change in input signal sensitivity. Further compensation, e.g. to "tune out" these capacitances, is provided by a tuning inductor 31 connected in series with the RF load resistance 30.

Even with the balanced detector circuit of FIG. 3 or the improved balance detector circuit of FIG. 4, power detection, as represented by the output signal voltage, is still nonlinear with respect to frequency and input RF signal power. Due to these frequency and input RF signal power dependencies, the power detection afforded by these circuits is unpredictable. Correction, or calibration, factors must be introduced which correspond to both numerous input frequencies and numerous input RF signal power levels to compensate for these nonlinearities.

Advances in digital electronic devices and programmable memories has resulted in correction circuits for diode detectors. A typical "corrected" detector circuit includes a resident memory chip having a look-up table for converting the diode's output voltages into a desired linear, or other idealized, response. In principal, the memory needs only to be programmed once by the manufacturer who has access to a suitable means of calibration.

However, due to the aforementioned nonlinear diode characteristics, numerous calibration points are required, particularly if the power sensor is to accurately detect power over a wide range of frequencies and input RF signal power levels. In order to accomplish such correction, or calibration, two "dimensions" of calibration are required: (1) calibration of frequency response since the detected output voltage varies with frequency due to the inherent reactive components of a diode 10, as discussed above; and (2) calibration of voltage output versus input signal power level. True correction would require that calibration factors be stored for all expected input RF signal power levels for all expected frequencies. This would require that a vast amount of data be stored in the resident memory, which in turn, would result in a very slow detector response time due to the need to access the appropriate two-dimensional correction factor each time a measurement is made. This would seriously detract from the most desirable property of a diode detector, namely its fast response time.

SUMMARY OF THE INVENTION

An RF power sensor in accordance with the present invention provides RF signal power sensing with reduced dependency upon input RF signal power. The effects of inherently power-dependent components within the power sensor are reduced, thereby giving the power sensor a wider accurate dynamic range.

The present invention includes at least two series-connected detector diodes coupling the input node, shunted by a load resistance, and the output node, shunted by a bypass capacitance. The multiple series-connected diodes have increased junction capacitances due to reduced reverse junction bias voltages. The increased junction capacitances experience reduced fractional capacitance changes due to changes in the input RF signal power level. This causes the fractional junction capacitance changes as a function of input RF signal power variations to be reduced, thereby resulting in reduced input RF signal power dependency of the diode's junction capacitances, and therefore the power sensor in general. Thus, the power detection performed by the diodes becomes more linear as a function of input RF signal power.

These and other objectives, features and advantages of the present invention will be understood upon consideration of the following detailed description of the invention and the accompanying drawings.

DETAILED DESCRIPTION OF THE INVENTION

Figure 5:
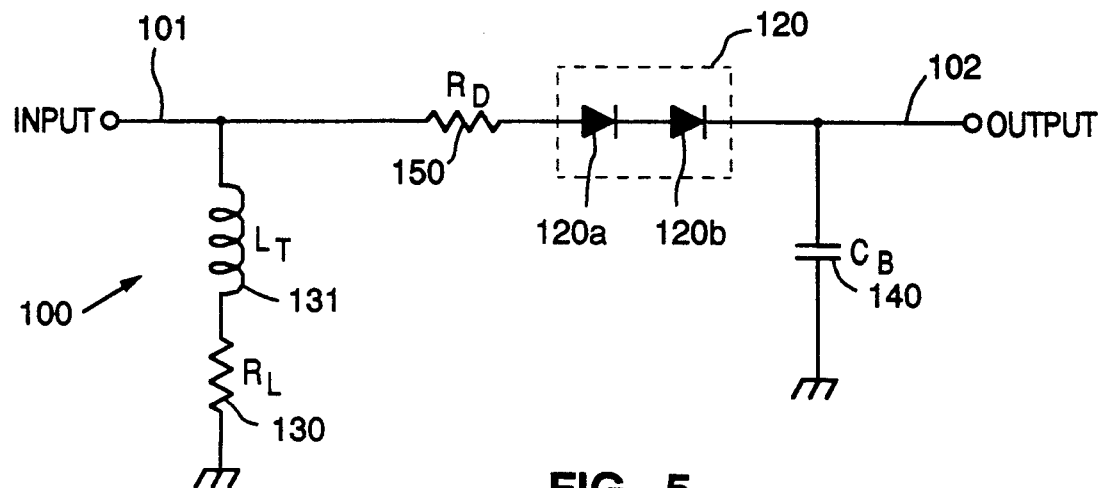
FIG. 5 illustrates a schematic circuit diagram of an improved diode power sensor in accordance with the present invention.

Referring to FIG. 5, an improved RF diode power sensor in accordance with the present invention includes multiple detector diodes 120, resistors 130, 150, an inductor 131 and a capacitor 140, all interconnected substantially as shown. The input node 101 is shunted by a load resistance 130 connected in series with a tuning inductor 131. The output node 102 is shunted by a bypass capacitor 140. Connecting the input 101 and output 102 nodes are multiple detector diodes 120 connected in series with a damping resistor 150.

An RF power sensor in accordance with the present invention uses multiple series-connected detector diodes 120 between its input 101 and output 102 nodes. In the embodiment illustrated in FIG. 5, two series-connected diodes 120a and 120b are illustrated. However, it should be understood that additional diodes can be used as desired.

In a preferred embodiment of the power sensor 100 of FIG. 5, the diodes 120a, 120b are low-capacitance Schottky Barrier type diodes (alternatively zero-bias or low-barrier Schottky diodes), and approximate values for the passive components are: 50 ohms for the damping resistance 150; 50 ohms for the load resistance 130; 0.2 nanohenries for the tuning inductance 131; and 100 picofarads for the bypass capacitance 140.

Figure 1:
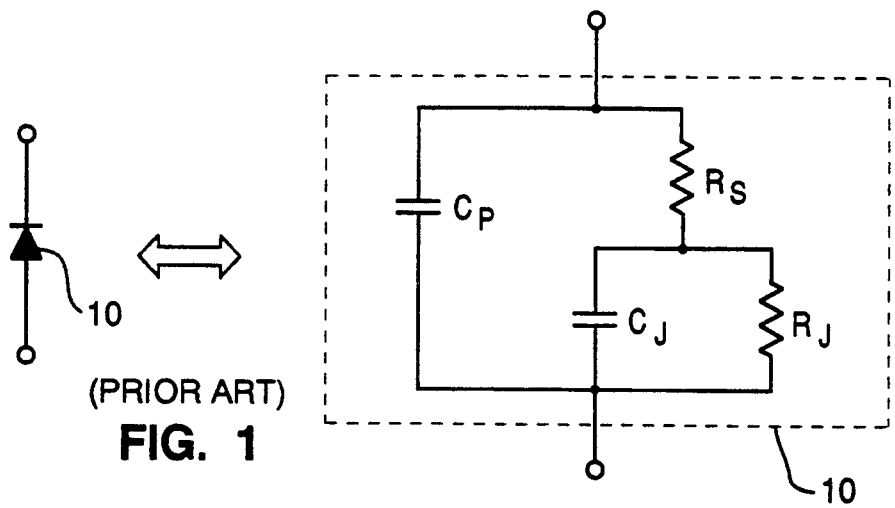
FIG. 1 illustrates a schematic circuit diagram of a conventional equivalent circuit model for a semiconductor diode.
Figure 2:
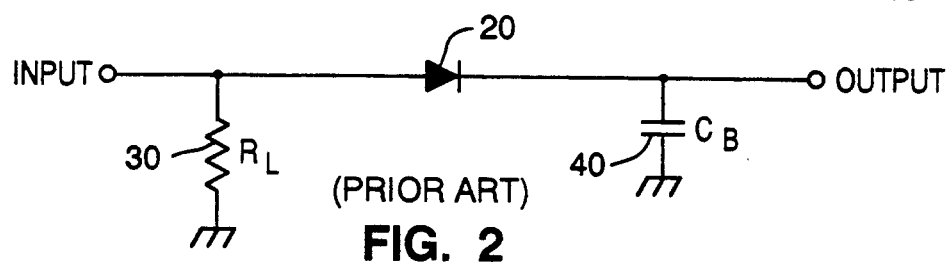
FIG. 2 illustrates a schematic circuit diagram of a conventional diode power sensor.
Figure 3:
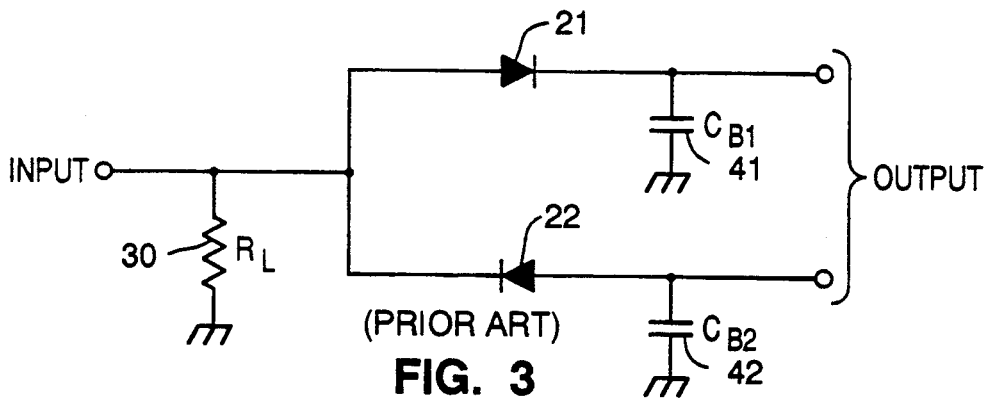
FIG. 3 illustrates a schematic circuit diagram of a conventional balanced diode power sensor.
Figure 4:
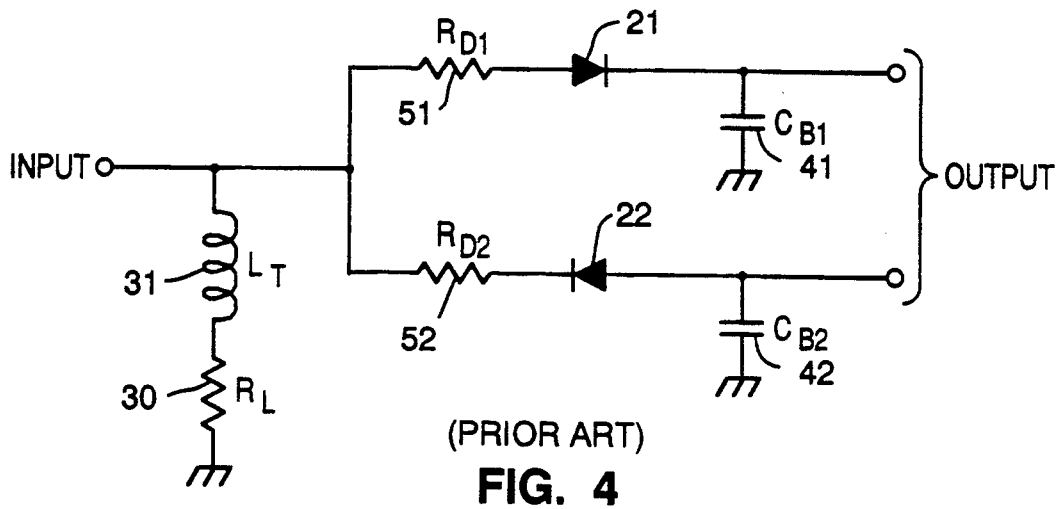
FIG. 4 illustrates a schematic circuit diagram of a conventional improved balanced diode power sensor.

The primary mechanism for distortion of the detected output voltage versus frequency characteristic is fractional variation, or "modulation," of the diode's junction capacitance $C_J$ (see FIG. 1 and discussion above) as a function of the input RF signal power. The detected output voltage is essentially determined by a voltage divider formed by the junction capacitance $C_J$ and the diode's epitaxial series resistance $R_S$. At lower frequencies, the junction capacitance $C_J$ represents a virtually open circuit, thereby causing the full RF input voltage swing to appear across the diode junction.

At higher frequencies, the capacitive reactance of the junction capacitance $C_J$ becomes comparable in value to the epitaxial series resistance $R_S$, thereby causing a roll-off in detection sensitivity. This effect is aggravated at higher power levels where the junction capacitance $C_J$ decreases in value due to the outwardly opposing movement of the depletion boundaries of the diode.

An improved power sensor 100 in accordance with the present invention uses at least two detector diodes 120a, 120b connected in series. This causes the effective value of junction capacitance for the composite series-connected pair 120 of diodes to be reduced to approximately one-half. This further causes the voltage swing across each diode 120a, 120b of the diode pair 120 to also be reduced by approximately one-half. Consequently, fractional changes in the junction capacitances, or junction capacitance modulation, is substantially reduced. This results in power detection which is substantially more linear as a function of input RF signal power.

Figure 6:
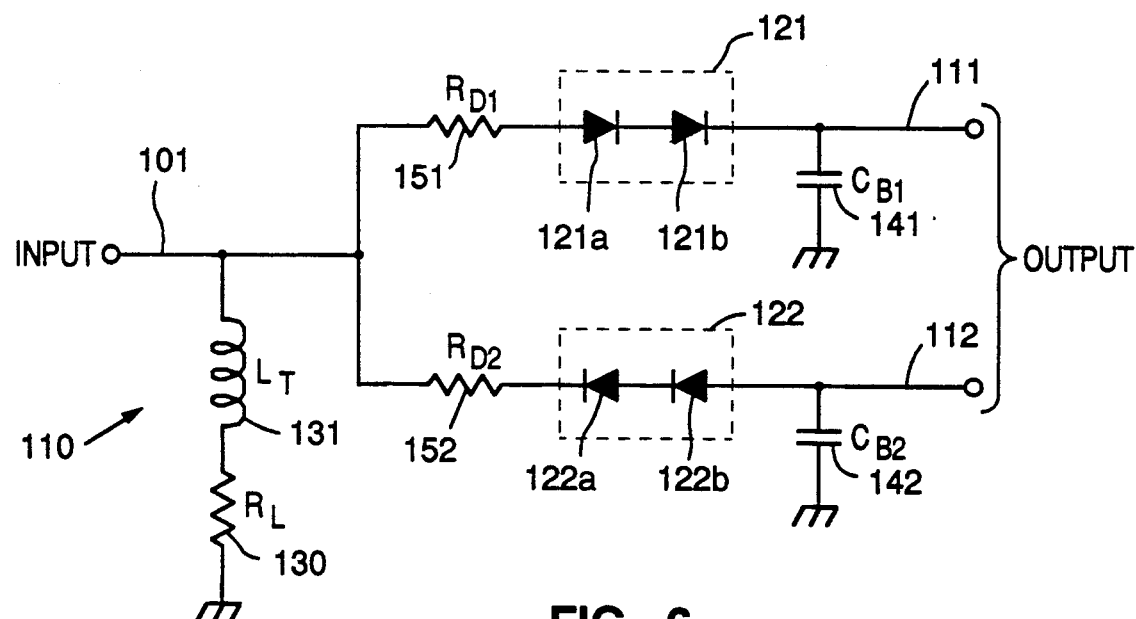
FIG. 6 illustrates a schematic circuit diagram of an improved balanced diode power sensor in accordance with the present invention.

Referring to FIG. 6, an improved balanced RF diode power sensor 110 in accordance with the present invention includes multiple detector diodes 121, 122, resistors 130, 151, 152, an inductor 131 and capacitors 141, 142, all interconnected substantially as shown. The input node 101 is shunted by a series-connected load resistance 130 and tuning inductor 131. Each of the differential output nodes 111, 112 is shunted by its respective bypass capacitance 141, 142. Connecting the input node 101 to the first output node 111 is a series-connected pair 121 of detector diodes 121a, 121b connected in series with a damping resistance 151. Connecting the input node 101 to the second output node 112 is a series-connected pair 122 of detector diodes 122a, 122b connected in series with a damping resistance 152. This balanced detector configuration 110 provides a differential output with the benefit of more linear power detection as a function of input RF signal power, as discussed above.

In a preferred embodiment of the balanced power sensor 110 of FIG. 6, the diodes 121a, 121b, 122a, 122b are low-capacitance Schottky Barrier type diodes, and approximate values for the passive components are: 50 ohms for the damping resistances 151, 152; 50 ohms for the load resistance 130; 0.2 nanohenries for the tuning inductance 131; and 100 picofarads for the bypass capacitances 141, 142.

It should be understood that the present invention is not limited to the use of only two detector diodes in series. As desired, more than two series-connected detector diodes can be used in accordance with the present invention. It should be further understood that a power sensor in accordance with the present invention can be fabricated from various forms of detector diodes, such as discrete diodes in chip or packaged forms, or monolithic diodes within a common integrated circuit. Moreover, the passive components (e.g. particularly the tuning inductance and bypass capacitances) can be realized with discrete, lumped component elements, or alternatively, with discrete, lumped component elements in combination with parasitic elements.

It should be still further understood that circuit realizations of a power sensor in accordance with the present invention can include discrete packaged devices interconnected on a printed circuit board, chip and thin film or thick film devices interconnected in a hybrid circuit form, or in monolithic integrated circuit form. For example, a circuit realization of a power sensor in accordance with the present invention can be achieved according to design and fabrication techniques disclosed in U.S. Pat. No. 4,360,865.

Various alternatives to the embodiments of the present invention described herein can be employed in practicing the present invention. It is intended that the following claims define the scope of the present invention, and that structures and methods within the scope of these claims and their equivalents be covered thereby.

What is claimed is:

1. A radio frequency power sensor providing power sensing with reduced input signal frequency and power dependency, said power sensor comprising:
   an input node for receiving a radio frequency input signal having an input signal power;
   an output node for providing an output voltage representing said input signal power;
   an input shunt impedance coupled between said input node and a circuit ground reference;
   detector means for detecting said input signal power, wherein said detector means is coupled between said input node and said output node and comprises a plurality of series-connected diodes; and
   an output shunt impedance coupled between said output node and said circuit ground reference.

2. A power sensor as recited in claim 1, wherein said input shunt impedance comprises a preselected resistance.

3. A power sensor as recited in claim 2, wherein said input shunt impedance further comprises a preselected inductance.

4. A power sensor as recited in claim 1, wherein said detector means further comprises a preselected resistance.

5. A power sensor as recited in claim 1, wherein said output shunt impedance comprises a preselected capacitance.

6. A power sensor as recited in claim 1, wherein at least one of said series-connected diodes comprises a Schottky diode.

7. A balanced radio frequency power sensor providing balanced power sensing with reduced input signal frequency and power dependency, said balanced power sensor comprising:
   an input node for receiving a radio frequency signal having an input signal power;
   a first output node for providing a first output voltage representing said input signal power;
   a second output node for providing a second output voltage representing said input signal power;
   an input shunt impedance coupled between said input node and a circuit ground reference;
   first detector means for detecting said input signal power, wherein said first detector means is coupled between said input node and said first output node and comprises a first plurality of series-connected diodes;
   second detector means for detecting said input signal power, wherein said second detector means is coupled between said input node and said second output node and comprises a second plurality of series-connected diodes;
   a first output shunt impedance coupled between said first output node and said circuit ground reference; and
   a second output shunt impedance coupled between said second output node and said circuit ground reference.

8. A balanced power sensor as recited in claim 7, wherein said input shunt impedance comprises a preselected resistance.

9. A balanced power sensor as recited in claim 8, wherein said input shunt impedance further comprises a preselected inductance.

10. A balanced power sensor as recited in claim 7, wherein said first and second detector means further comprise first and second preselected resistances, respectively.

11. A balanced power sensor as recited in claim 7, wherein said first and second output shunt impedances comprise first and second preselected capacitances, respectively.

12. A balanced power sensor as recited in claim 7, wherein at least one of said series-connected diodes in each of said first and second detector means comprises a Schottky diode.

* * * * *